(12) United States Patent
Lee et al.

(10) Patent No.: US 7,663,931 B2
(45) Date of Patent: Feb. 16, 2010

(54) WORD LINE DRIVING METHOD OF SEMICONDUCTOR MEMORY DEVICE

(75) Inventors: Kang-Seol Lee, Kyoungki-do (KR); Seok-Cheol Yoon, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 24 days.

(21) Appl. No.: 11/819,806

(22) Filed: Jun. 29, 2007

(65) Prior Publication Data
US 2008/0159054 A1    Jul. 3, 2008

(30) Foreign Application Priority Data
Dec. 27, 2006   (KR) ..................... 10-2006-0134342

(51) Int. Cl.
G11C 8/00    (2006.01)
G11C 11/34   (2006.01)
G11C 16/04   (2006.01)
G11C 7/00    (2006.01)

(52) U.S. Cl. ............................. 365/185.23; 365/185.18; 365/189.09; 365/189.11; 365/222; 365/230.06

(58) Field of Classification Search ............ 365/185.18, 365/185.23, 189.09, 189.11, 230.06, 222
See application file for complete search history.

(56) References Cited

U.S. PATENT DOCUMENTS

| 5,257,238 | A | * | 10/1993 | Lee et al. ............... 365/230.06 |
|---|---|---|---|---|
| 6,236,617 | B1 | | 5/2001 | Hsu et al. |
| 6,337,595 | B1 | | 1/2002 | Hsu et al. |
| 6,477,076 | B2 | | 11/2002 | Kim |
| 6,909,660 | B2 | * | 6/2005 | Oh ............................. 365/229 |
| 7,009,904 | B2 | | 3/2006 | Kim |
| 7,085,191 | B2 | | 8/2006 | Rehm et al. |
| 7,142,446 | B2 | | 11/2006 | Derner et al. |
| 2005/0068836 | A1 | * | 3/2005 | Oh ............................. 365/229 |
| 2006/0098523 | A1 | * | 5/2006 | Takita et al. .......... 365/230.06 |
| 2006/0146616 | A1 | * | 7/2006 | Heo et al. .............. 365/189.09 |
| 2006/0291321 | A1 | * | 12/2006 | Leung .................. 365/230.06 |

FOREIGN PATENT DOCUMENTS

| KR | 1998-0057132 | 9/1998 |
|---|---|---|
| KR | 10-2002-0059916 A | 7/2002 |
| KR | 102005005992 A | 6/2005 |

OTHER PUBLICATIONS

Korean Office Action issued in Korean Patent Application No. KR 10-2006-0134342, dated on Feb. 29, 2008.

* cited by examiner

*Primary Examiner*—Ly D Pham
(74) *Attorney, Agent, or Firm*—IP & T Law Firm PLC

(57) ABSTRACT

A semiconductor memory device includes a low voltage supplier for supplying a low voltage lower than a ground voltage; a voltage selector for selecting one of the low voltage and the ground voltage; and a word line driving circuit for driving a word line in response to an output of the voltage selector. The voltage selector operates when a self refresh signal is inputted, and supplies the low voltage as a voltage of logic low level used in the word line driving circuit in a self refresh mode and supplies the ground voltage as a voltage of logic low level used in the word line driving circuit in modes other than the self refresh mode.

6 Claims, 6 Drawing Sheets

WORD LINE DRIVING METHOD OF SEMICONDUCTOR MEMORY DEVICE

CROSS-REFERENCE TO RELATED APPLICATION

The present invention claims priority of Korean patent application number 10-2006-0134342, filed on Dec. 27, 2006, which is incorporated by reference in its entirety.

BACKGROUND OF THE INVENTION

The present invention relates to a semiconductor memory device; and, more particularly, to a semiconductor memory device which performs a negative word line driving.

It is known that a negative word line drive mode refers to a mode that supplies a high voltage VPP to a word line when enabling the word line and a voltage VBBW lower than a ground voltage VSS thereto when disabling the same, in driving it by a word line driving circuit.

The use of the negative word line drive mode increases refresh characteristics and also improves other AC parameters. Especially, the negative voltage VBBW lower than the ground voltage VSS is used as a voltage for disabling the word line, which increases a refresh period due to an extension of information retention time. In addition, the negative word line drive mode is employed because it has several advantages that decrease a VPP burden and improve write recovery time TWR in case of using a low Vcc.

FIG. 1 is a block diagram of a conventional semiconductor memory device which performs a negative word line driving.

As shown in the drawing, the conventional semiconductor memory device includes a block selection address generator 10, a row decoder controller 20, a sub-driver 30, a main word line driver 40 and a sub word line driver 50.

In a brief operation, a block selection address BAX having block information is generated by the block selection address generator 10 by an active signal. The main word line driver 40 is driven by a block selection address BAX-12 to select a main word line MWLB, and the sub-driver 30 is driven by a block selection address BAX0, 1, 2. In response to an output FXB of the sub-driver 30, the sub word line driver 50 is driven to select a sub word line SWL.

The row decoder controller 20 generates a word line off signal WLOFF for disabling a word line. Based on this word line off signal WLOFF, the sub-driver 30 and the main word line driver 40 are controlled. In other words, the word line enabling is done by the block selection address BAX, while the word line disabling is done by the word line off signal WLOFF.

In FIG. 1, arrows towards each of the blocks 20 to 50 imply that each block uses the negative word line drive mode with a voltage VBBW lower than the ground voltage VSS as a power supply voltage of logic low level of the operating voltages of the corresponding block. That is, the voltage VBBW lower than the ground voltage VSS is supplied to the word line when disabling it.

Meanwhile, the refresh property of the semiconductor memory device depends upon the capability of the word line for preservation of data stored in cells. Namely, as the data retention time of cell becomes longer, it may be considered as good products in terms of performance and reliability. To increase the preservation of cell data, therefore, the negative word line drive mode using the voltage VBBW lower than the ground voltage VSS as the word line off voltage has been employed, as stated above.

However, in the semiconductor memory device, an active signal may be inputted every tRRD, and the write or read operation may be repeated while making bank active every clock without disconnection. In this case, the use of the negative word line drive mode may cause a power hungry phenomenon due to current consumption for generation of low voltage VBBW. Herein, tRRD indicates time period from active to active command.

Further, the swing width of signal becomes large from VPP to VBBW, which results in a severe malfunctioning in the refresh and normal operations by noises, rather than increasing the retention time of cell that is the fundamental purpose of the negative word line drive mode. As a result, this has a bad influence on the reliability of the memory device.

SUMMARY OF THE INVENTION

Embodiments of the present invention are directed to providing a semiconductor memory device for selectively driving a word line with a ground voltage or a low voltage having lower voltage level than the ground voltage.

In accordance with an aspect of the present invention, there is provided a semiconductor memory device including a low voltage supplier for supplying a low voltage lower than a ground voltage; a voltage selector for selecting one of the low voltage and the ground voltage; and a word line driving circuit for driving a word line in response to an output of the voltage selector. The voltage selector operates when a self refresh signal is inputted, and supplies the low voltage as a voltage of logic low level used in the word line driving circuit in a self refresh mode and supplies the ground voltage as a voltage of logic low level used in the word line driving circuit in modes other than the self refresh mode.

DESCRIPTION OF SPECIFIC EMBODIMENTS

Hereinafter, a preferred embodiment of the present invention will be described in detail with reference to the accompanying drawings so that the invention can be easily practiced by those skilled in the art to which the invention pertains.

Figure 1:
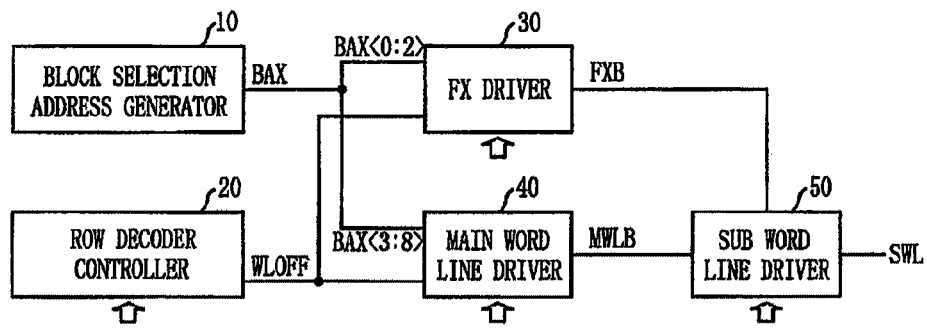
FIG. 1 is a block diagram of a conventional semiconductor memory device which performs a negative word line driving.
Figure 2:
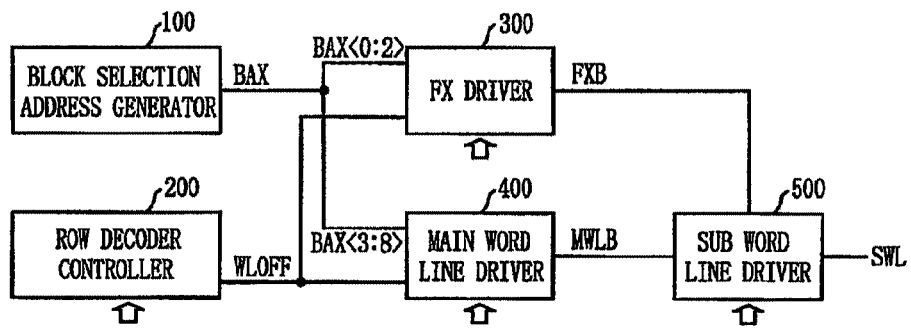
FIG. 2 is a block diagram illustrating a structure of a semiconductor memory device which selectively performs a negative word line driving in accordance with a preferred embodiment of the present invention.
Figure 2:
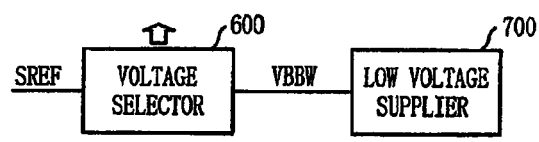

FIG. 2 is a block diagram illustrating a structure of a semiconductor memory device which selectively performs a negative word line driving in accordance with a preferred embodiment of the present invention.

As shown FIG. 2, the semiconductor memory device of the present invention includes a low voltage supplier 700 for supplying a low voltage VBBW lower than a ground voltage VSS, and a voltage selector 600 for selecting one of the low voltage VBBW and the ground voltage VSS and supplying the selected voltage to a word line driving circuit, thereby selectively performing a negative word line driving.

The voltage selector 600 operates when a self refresh signal SREF is inputted, and supplies the low voltage VBBW as a voltage of logic low level used in the word line driving circuit in a self refresh mode to drive the word line driving circuit in a negative word line manner and supplies the ground voltage VSS as a voltage of logic low level used in the word line driving circuit in modes other than the self refresh mode.

As shown in FIG. 2, the word line driving circuit is provided with a block selection address generator 100 for generating a block selection address BAX, a row decoder controller 200 for generating a word line disable control signal WLOFF to control a main word line driver 400 and a sub-driver 300, the main word line driver 400 for coding coded signals of a portion of block selection address signals BAX3 to BAX12 and the word line disable signal WLOFF to drive the main word line, the sub-driver 300 for coding coded signals of a portion of block selection address signals BAX0 to BAX2 and the word line disable signal WLOFF to output a sub-driver output signal FXB, and a sub word line driver 500 for driving a sub word line in response to the Sub-driver output signal FXB and an output signal MWLB of the main word line driver.

Arrows towards each of the blocks shown in FIG. 2 mean that each block receives a voltage of logic low level from the voltage selector 600. As set forth above, each block takes the low voltage VBBW or ground voltage VSS depending on whether the current operation mode is a self refresh mode or not.

Figure 3:
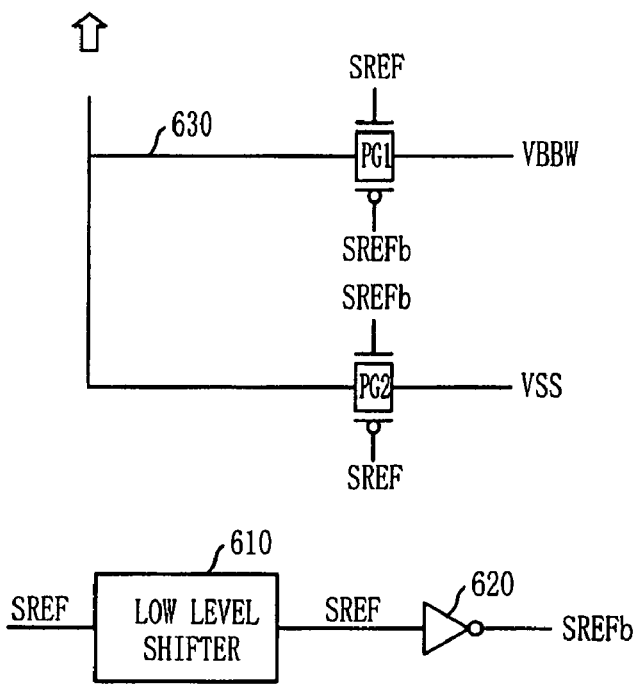
FIG. 3 is a detailed circuit diagram illustrating one example of a voltage selector depicted in FIG. 2.

FIG. 3 is a detailed circuit diagram illustrating one example of the voltage selector 600 depicted in FIG. 2.

The voltage selector 600 supplies the low voltage VBBW to each block of the word line driving circuit in the self refresh mode and the ground voltage VSS thereto as a voltage of logic low level in modes other than the self refresh mode.

As shown in FIG. 3, the voltage selector 600 may be composed of a first pass gate PG1 which supplies the low voltage VBBW to an output end 630 of the voltage selector 600 and is turned on when the self refresh signal SREF of a logic high level is inputted, and a second pass gate PG2 which supplies the ground voltage VSS to an output end 630 of the voltage selector 600 and is turned on when the self refresh signal SREF of a logic low level is inputted.

The first pass gate PG1 may be composed of an NMOS transistor whose gate takes the self refresh-signal SREF and drain-source transmission line is connected to the low voltage VBBW and an output end 630 of the voltage selector, and a PMOS transistor whose gate takes an inverted signal SREFb of the self refresh signal SREF and drain-source transmission line is connected to the low voltage VBBW and an output end 630 of the voltage selector 600.

The second pass gate PG2 may be composed of an NMOS transistor whose gate takes an inverted signal SREFb of the self refresh signal SREF and drain-source transmission line is connected to the ground voltage VSS and an output end 630 of the voltage selector 600, and a PMOS transistor whose gate takes the self refresh signal SREF and drain-source transmission line is connected to the ground voltage VSS and an output end 630 of the voltage selector 600.

The voltage selector 600 may receive the self refresh signal SREF via a low level shifter 610 as shown in FIG. 3, to conform its logic low level to the level of the low voltage VBBW.

The low voltage supplier 700 generates the low voltage lower than the ground voltage and is well-known in the art, and therefore, details thereof will be omitted here for simplicity.

Although the embodiment shown in FIGS. 2 and 3 uses the self refresh signal as a signal to determine whether to drive the negative word line, the core contents of the present invention may select whether to drive the negative word line. Thus, it would be impossible to determine whether to drive the negative word line by any other signal according to the necessity. For example, a signal associated with an auto refresh operation may be used to determine whether to drive the negative word line.

Figure 4:
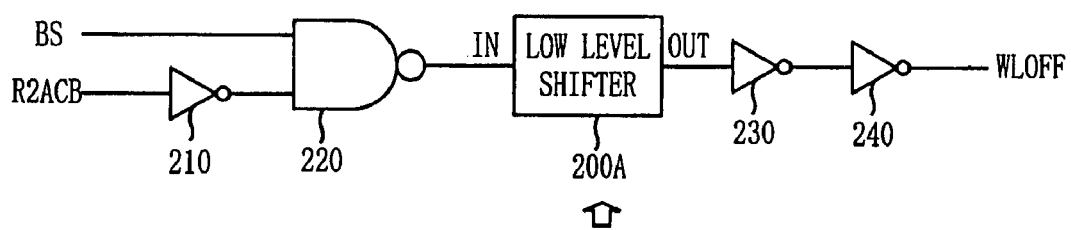
FIG. 4 is a detailed circuit diagram illustrating one example of a row decoder controller depicted in FIG. 2.

FIG. 4 is a detailed circuit diagram illustrating one example of the row decoder controller 200 depicted in FIG. 2.

The row decoder controller 200 generates the word line disable signal WLOFF to control the main word line driver 400 and the sub-driver 300.

In operation, an inverted signal of a signal R2ACB for determining a precharge timing by an inverter 210 and a block selection enable signal BS are combined by a NAND gate 220. A voltage level of an output signal of the NAND gate 220 is shifted by a low level shifter 200A and then outputted as the word line disable signal WLOFF by way of inverters 230 and 240. That is, the word line disable signal WLOFF drops to a logic low level when the block enable signal BS is a logic high level and the signal for determining the precharge timing is a logic low level. In the drawing, an arrow towards the low level shifter 200A represents that the low level shifter 200A receives the voltage of logic low level, i.e., VSS or VBBW from the voltage selector 600.

Figure 5:
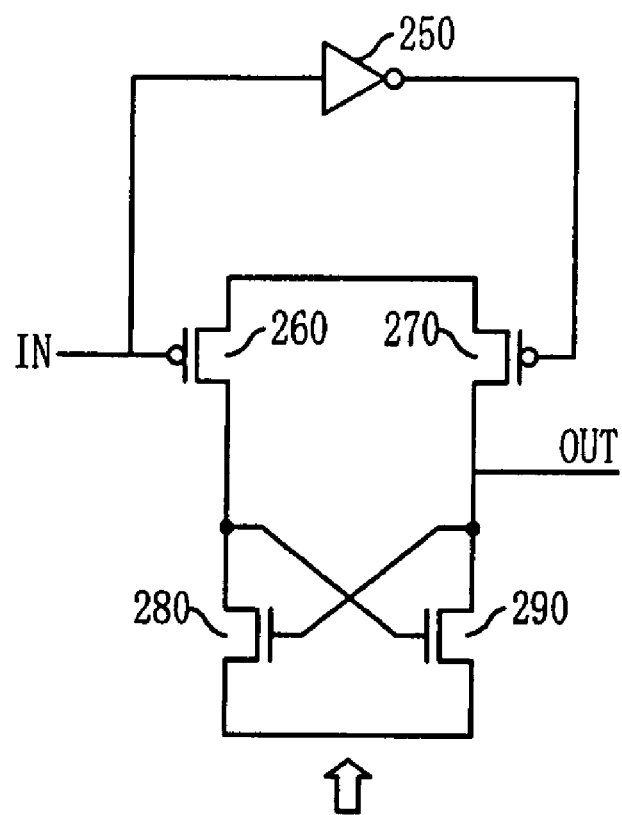
FIG. 5 is a detailed circuit diagram illustrating one example of a low level shifter depicted in FIG. 4.

FIG. 5 is a detailed circuit diagram illustrating one example of the low level shifter 200A depicted in FIG. 4.

When an input signal IN, an output signal of the NAND gate 220, is a logic high level, a PMOS transistor 270 is turned on by an output of an inverter 250 and thus an NMOS transistor 280 is turned on to output a power supply voltage as an output signal OUT. On the other hand, when an input signal IN is a logic low level, a PMOS transistor 260 is turned on and thus an NMOS transistor 290 is turned on to output a voltage level, i.e., a voltage of logic low level supplied from the voltage selector 600 of a lower end of the NMOS transistor as an output signal OUT.

In other words, the low level shifter of the conventional negative word line driving circuit always shifts the voltage of logic low level to VBBW, but the low level shifter of the present invention shifts it to the voltage supplied from the voltage selector 600 and outputs the same. Thus, the logic low level of signal outputted from the row decoder controller 200 becomes the level of voltage supplied from the voltage selector 600.

An arrow shown in the drawing means that the voltage selector 600 supplies the voltage to a node indicated by it.

Figure 6:
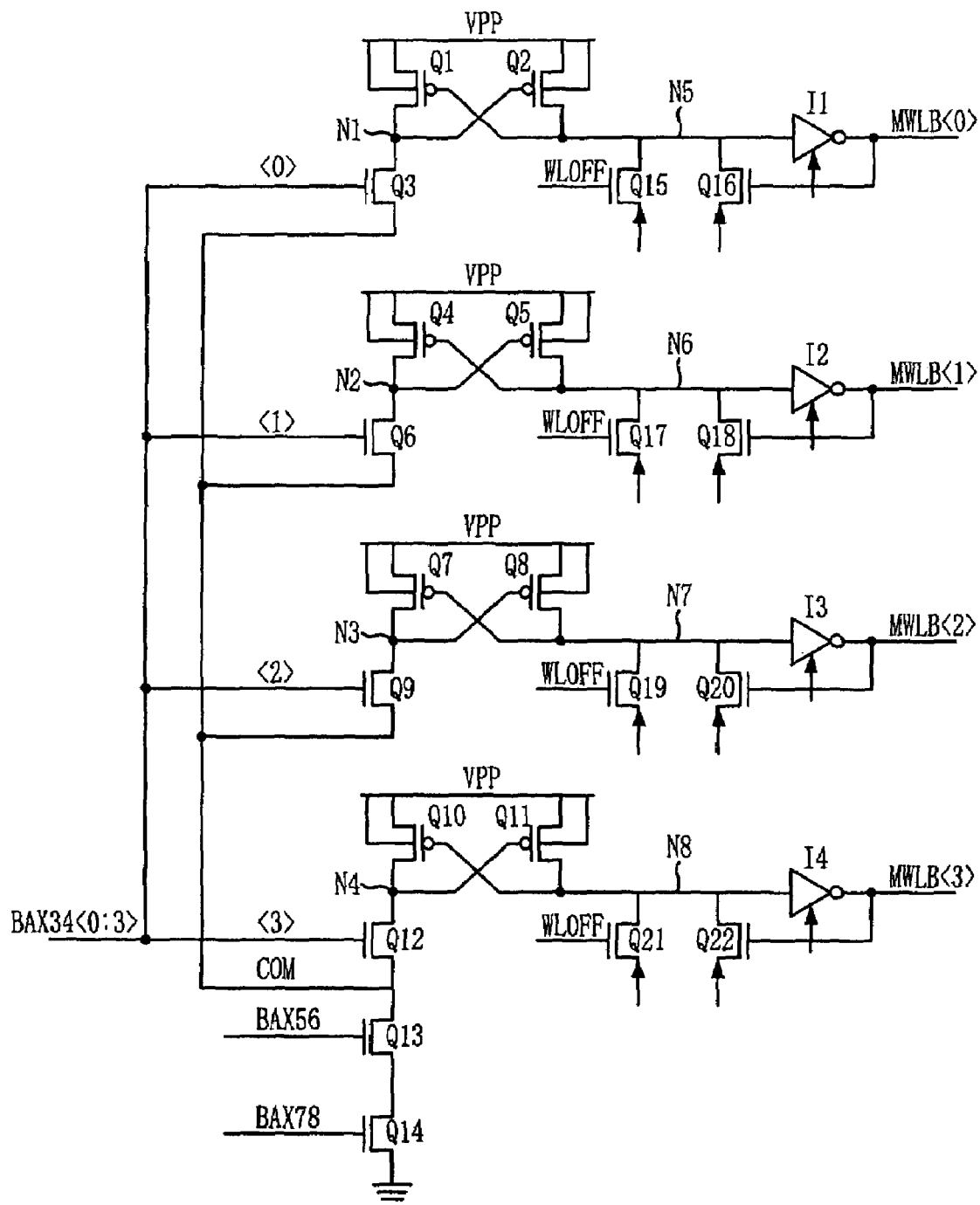
FIG. 6 is a detailed circuit diagram illustrating one example of a main word line driver depicted in FIG. 2.

FIG. 6 is a detailed circuit diagram illustrating one example of the main word line driver 400 depicted in FIG. 2.

The main word line driver 400 serves to code coded signals of a portion BAX3 to BAX12 of the block address signals and the word line disable signal WLOFF to drive the main word line.

When the word line disable signal WLOFF from the row decoder controller 200 is a logic high level, NMOS transistors Q15, Q17, Q19 and Q21, and each of PMOS transistors Q1, Q4, Q7 and Q10 of a pair of cross coupled PMOS transistors P1 to P4 are turned on. Therefore, nodes N5 to N8 are discharged to a voltage level, i.e., VSS or VBBW indicated by an arrow, so that each of outputs of the inverters I1 to I4 becomes a logic high level. Accordingly, inversion word lines MWLB<0> to MWLB<3> of the first to fourth main word lines become a logic high level. When the inversion word lines MWLB<0> to MWLB<3> of the first to fourth main word lines become a logic high level, each of the NMOS transistors Q16, Q18, Q20 and Q22 is turned on to latch the voltage, i.e., VSS or VBBW indicated by an arrow, being applied to each of the nodes N5 to N8. As a result, each of NMOS transistors Q16, Q18, Q20 and Q22 operates as a latch.

A pre-decoded signal BAX34<0:3> of the block selection address BAX34 is applied to the gate of each of NMOS transistors Q3, Q6, Q9 and Q12. The sources of the NMOS transistors Q3, Q6, Q9 and Q12 are coupled to a common node COM.

Further, one of pre-decoded signals BAX56<0:3> of the block selection address BAX56 is applied to the NMOS transistor Q13, and one of pre-decoded signals BAX78<0:3> of the block selection address BAX78 is applied to the gate of the NMOS transistor Q14, thereby turning on or off these transistors Q13 and Q14.

When the NMOS transistor Q3 is turned on by the pre-decoded signal BAX34<0> with the NMOS transistor Q13 being tuned on, an electric potential of the node N1 is discharged to the VSS level, thereby making the PMOS transistor Q2 turned on. Therefore, the electric potential of the node N5 is transited from the voltage indicated by an arrow to the VPP level. Thus, the inversion word line MWLB<0> of the first main word line is transited to the voltage level indicated by an arrow. The remaining inversion word lines MWLB<1>, MWLB<2> and MWLB<3> of second though fourth main word lines are also driven.

In the main word line driver of the conventional negative word line drive mode, the low voltage VBBW is always applied to the nodes in the direction of arrow in the drawing, and thus, the electric potential of logic low level outputted from the main word line driver was always the low voltage VBBW. However, in the main word line driver 400 of the present invention, since the low voltage VBBW or ground voltage VSS is applied to the nodes in the direction of arrow from the voltage selector 600, the electric potential of logic low level of the output signals is variable and the selection of the negative drive mode or normal drive mode is possible.

Figure 7:
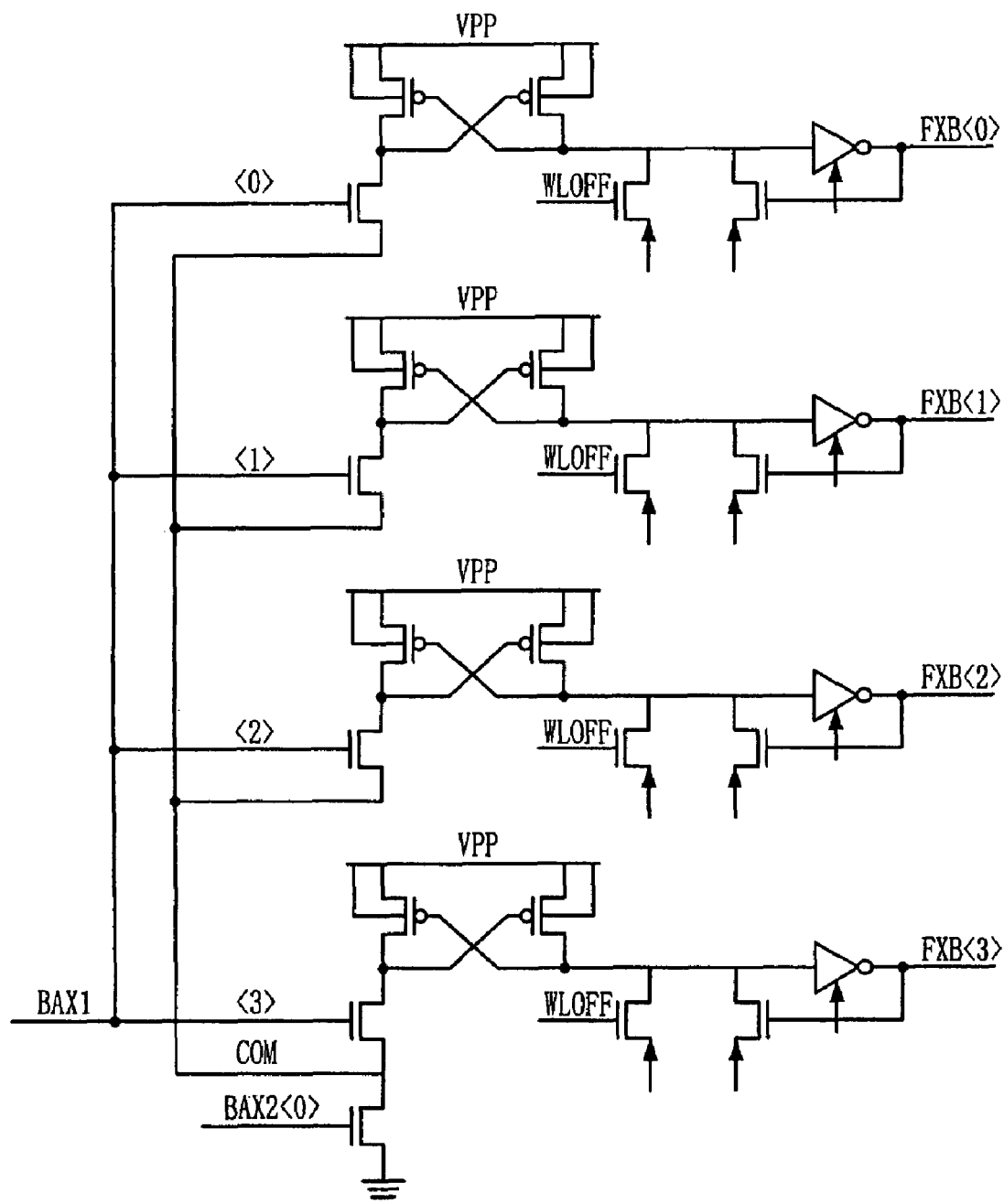
FIG. 7 is a detailed circuit diagram illustrating one example of a sub-driver depicted in FIG. 2.

FIG. 7 is a detailed circuit diagram illustrating one example of the sub-driver 300 depicted in FIG. 2.

The sub-driver 300 codes coded signals of portions BAX0, BAX1, and BAX2 of the block selection address signals and the word line disable signal WLOFF to output a sub-driver output signal FXB. The sub-driver 300 is the same as the main word line driver 400 in their drive mode except that it codes other block selection addresses BAX0, BAX1 and BAX2 to output a sub-driver output signal FXB.

Thus, the sub-driver 300 selectively gets the ground voltage VSS or low voltage VBBW supplied to the nodes in the direction of arrow, and operates with the voltage in a negative drive mode or a normal drive mode.

Figure 8:
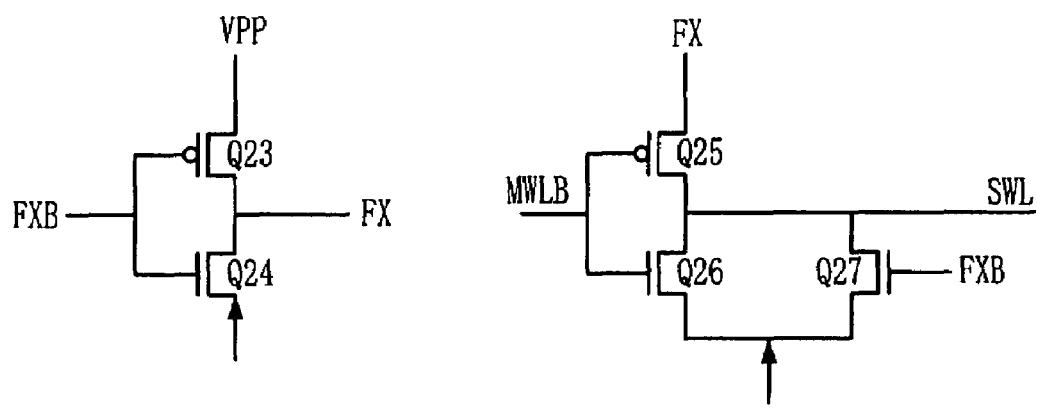
FIG. 8 is a detailed circuit diagram illustrating one example of a sub work line driver depicted in FIG. 2.

FIG. 8 is a detailed circuit diagram illustrating one example of the sub work line driver 500 depicted in FIG. 2.

The sub word line driver 500 takes an output signal FXB of the sub-driver 300 selected in conformity with a combination of the block selection addresses BAXs and an output signal MWLB of the main word line driver, to drive the sub word line SWL.

As shown in FIG. 8, the sub word line driver 500 is composed of inverters Q23 and Q24 for inverting the output signal FXB of the sub-driver 300 to output a FX signal, and transistors Q25, S26 and Q27 for outputting a voltage level of the FX signal or a voltage level in the direction of an arrow to the sub word line SWL depending on the inversion word line MWLB of the main word line and a FXB signal.

The sub word line driver 500 selectively gets the low voltage VBBW or ground voltage VSS supplied to nodes, i.e., the sources of Q24, Q26 and Q27, in the direction of an arrow and selectively operates with the voltage in the negative drive mode or normal drive mode.

Figure 9:
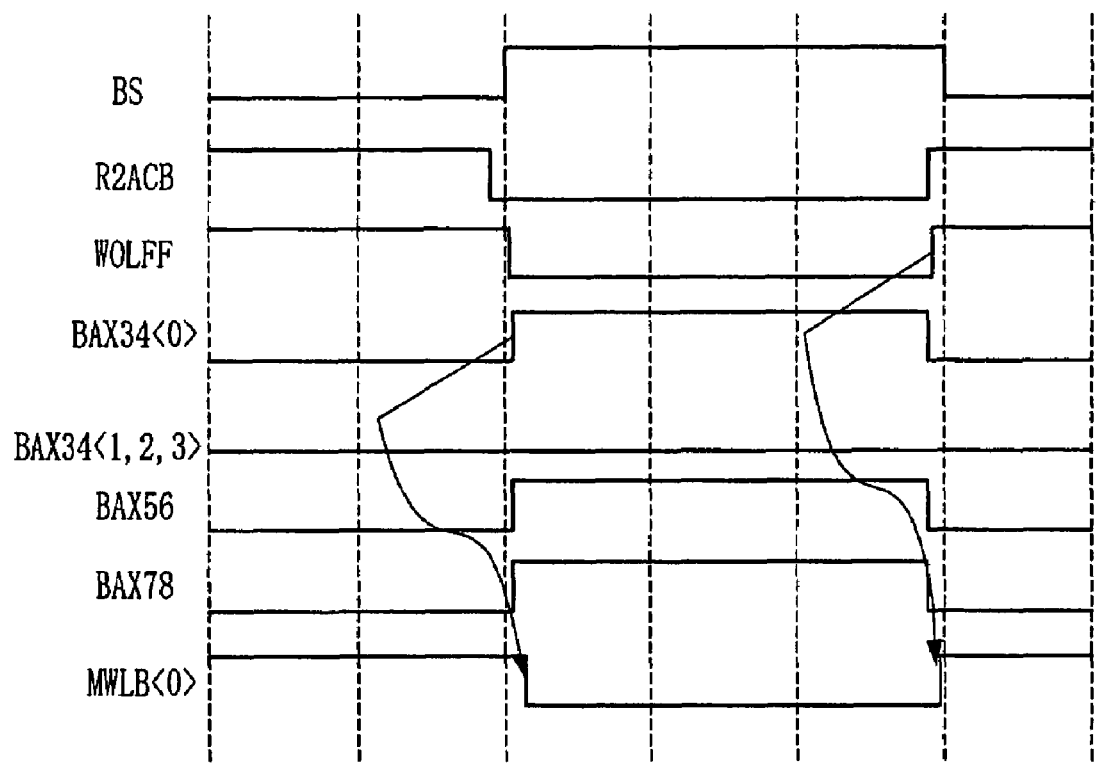
FIG. 9 shows a timing chart for explaining a general operation of the semiconductor memory device depicted in FIG. 2.

FIG. 9 shows a timing chart for explaining the general operation of the semiconductor memory device depicted in FIG. 2.

If the block selection enable signal BS is a logic high level and the signal R2ACB for deciding the precharge timing is a logic low level, the word line disable signal WLOFF becomes a logic low level VBBW or VSS. For example, if coded signals BAX34<0>, BAX56, and BAX78 of the block selection addresses are a logic high level, an inversion word line of the first main word line becomes a logic low level VBBW or VSS.

On the other hand, if the block selection enable signal BS is a logic low level and the signal R2ACB for deciding the precharge timing is a logic high level, the word line disable signal WLOFF becomes a logic high level. For example, if coded signals BAX34<0>, BAX56, and BAX78 of the block selection addresses are a logic low level, an inversion word line of the first main word line becomes a logic high level VPP.

Each of the blocks in the word line driving circuit is shown and explained in detail herein, but each block may be modified in various types. Although there may be various modifications of each of the blocks, it is of course possible to implement the semiconductor memory device that selectively operates in the negative word line by selectively supplying a logic low level voltage used in each block.

As described above, the present invention can drive a word line in a negative drive mode or normal drive mode according to situations by selectively supplying a logic low level voltage used in a word line driving circuit.

Thus, the present invention can prevent the problems such as a power hungry phenomenon and a reduction in chip reliability by noises which are disadvantages resulting from the negative drive mode, while having the advantages of the negative drive mode.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
a low voltage supplier for supplying a low voltage lower than a ground voltage;
a voltage selector for selecting one of the low voltage and the ground voltage; and
a word line driving circuit for driving a word line in response to an output of the voltage selector,
wherein the voltage selector operates when a self refresh signal is inputted, and supplies the low voltage as a voltage of logic low level used in the word line driving circuit in a self refresh mode and supplies the around voltage as the voltage of logic low level used in the word line driving circuit in modes other than the self refresh mode.

2. The semiconductor memory device as recited in claim 1, wherein the voltage selector includes:
- a first pass gate which supplies the low voltage to an output end of the voltage selector and is turned on when the self refresh signal of a logic high level is inputted; and
- a second pass gate which supplies the ground voltage to an output end of the voltage selector and is turned on when the self refresh signal of a logic low level is inputted.

3. The semiconductor memory device as recited in claim 2, wherein the first pass gate includes:
- an NMOS transistor whose gate takes the self refresh signal and drain-source transmission line is connected to the low voltage and an output end of the voltage selector; and
- a PMOS transistor whose gate takes an inverted signal of the self refresh signal and drain-source transmission line is connected to the low voltage and an output end of the voltage selector.

4. The semiconductor memory device as recited in claim 2, wherein the second pass gate includes:
- an NMOS transistor whose gate takes an inverted signal of the self refresh signal, and drain-source transmission line is connected to the ground voltage and an output end of the voltage selector; and
- a PMOS transistor whose gate takes the self refresh signal and drain-source transmission line is connected to the ground voltage and an output end of the voltage selector.

5. The semiconductor memory device as recited in claim 4, wherein the voltage selector receives the self refresh signal via a low level shifter to conform its logic low level to the level of the low voltage.

6. The semiconductor memory device as recited in claim 4, wherein the word line driving circuit includes:
- a block selection address generator for generating block selection addresses;
- a row decoder controller for generating a word line disable control signal to control a main word line driver and a FX driver;
- the main word line driver for coding coded signals of a portion of the block selection address signals and the word line disable signal to drive the word line;
- the sub-driver for coding coded signals of a portion of the block selection address signal and the word line disable signal to produce a sub-driver output signal; and
- a sub word line driver for driving a sub word line in response to the sub-driver output signal and an output signal of the main word line driver,
- the voltage supplied from the voltage selector being the voltage level of the logic low level of signals outputted from the row decoder controller, the main word line driver, the Sub-driver and the sub word line driver.

* * * * *